United States Patent [19]

Briscoe et al.

[11] Patent Number: 5,060,239
[45] Date of Patent: Oct. 22, 1991

[54] TRANSFER STROBE TIME DELAY SELECTOR AND METHOD FOR PERFORMING SAME

[75] Inventors: Milton R. Briscoe, Raleigh; Raymond E. Tyrrell, Wake Forest, both of N.C.

[73] Assignee: Alcatel NA Network Systems Corp., Raleigh, N.C.

[21] Appl. No.: 351,016

[22] Filed: May 12, 1989

[51] Int. Cl.[5] .............................................. H04L 27/28
[52] U.S. Cl. ....................................... 375/38; 370/84; 375/106
[58] Field of Search ................. 375/38, 102, 106, 118; 370/84, 102, 108; 341/61; 455/59

[56] References Cited

U.S. PATENT DOCUMENTS

| | | | |
|---|---|---|---|
| 4,580,279 | 4/1986 | Kahn | 370/102 |
| 4,596,026 | 6/1986 | Cease et al. | 375/118 |
| 4,617,658 | 10/1906 | Walters | 370/84 |
| 4,811,367 | 3/1989 | Tajika | 370/108 |
| 4,887,279 | 12/1989 | Odenheimer | 375/118 |

*Primary Examiner*—Stephen Chin
*Attorney, Agent, or Firm*—Peter C. Van Der Sluys

[57] ABSTRACT

A transfer strobe delay stage selector insures accurate transfer of data from high speed circuitry to low speed circuitry through use of a delay stage module comprising a plurality of delay stages, and an associated multiplexor for selecting one of the delay stages so as to provide accurate reception of parallel data by the low speed circuitry from the high speed circuitry. The transfer strobe delay stage selector incorporates a synchronization channel identification module for detecting synchronization channel information in the frames of data transferred from the high speed circuitry to the low speed circuitry and also includes control circuitry for adjusting the selected delay stage until synchronization channel identification is detected. A second embodiment of the invention provides an auxiliary synchronization channel identification module and associated control circuitry to dynamically adjust the selected delay stage when variation in the propagation delay between the high speed and low speed circuitry occurs.

30 Claims, 3 Drawing Sheets

TRANSFER STROBE TIME DELAY SELECTOR AND METHOD FOR PERFORMING SAME

FIELD OF THE INVENTION

The present invention relates to a transfer strobe time delay selector typically used in digital telephony but not restricted to such applications.

BACKGROUND OF THE INVENTION

The transfer of data between synchronous high speed digital circuits and synchronous low speed digital circuits has typically been achieved by reducing the transfer frequency at the boundary to the rate of the low speed circuits. This transfer frequency reduction can be accomplished through serial to parallel conversion of the data with a strobe being generated from the high speed section to initiate transfer. The transfer rate is limited by the timing resolution of the low speed circuits or by other limiting factors such as propagation delay time, and variations thereof. The slowest link in the path must not exceed the transfer period to insure accurate data transfer. This transfer period is pre-determined based on worse-case design analysis of propagation delays, data acquisition times (setup and hold times), wiring distances and variations of the above due to device process differences, temperature variations, power supply voltages, age of the components and the like.

Due to the many factors involved in the determination of a worse case timing resolution as well as the variations of such a determined resolution as a result of changes in temperature, voltage, production, and the like, typical transfer rates are greatly reduced from the potential rates that could exist given optimal conditions. Such reduced transfer rates limit circuit functionality, and generally increase circuit size and fabrication costs. One major impact is in the number of pins required for very large-scale integrated circuit (VLSI) devices to facilitate a low speed parallel transfer. The data must be divided down to a suitable period of time such that the data transfer period exceeds all timing uncertainties. This typically involves divisors of 4, 8, 16 or higher powers of 2 depending on the data transfer frequency, thereby resulting in corresponding pinout increases.

Packaging limitations in VLSI are the major obstacle in applying semiconductor technology. To date, transistor evolution has far outpaced packaging technology. Large pinout devices are generally not cost effective, consume large board areas and decrease reliability in proportion to the pinout increase. Likewise system constraints on board edge connectors and the numbers of input and output pins greatly favor reducing the number of connections necessary to convey high speed data.

The present invention allows automatic adaptation of the transfer strobe between the high speed and low speed circuits so as to compensate for timing drifts resulting from changes in system component operation induced by variations in temperature, voltage, path delay and the like. This invention thus increases the transfer rate toward an optimal amount, thereby minimizing the number of signal connections by minimizing the size of the parallel data word transferred.

In general, the invention uses additional circuitry and data overhead to communicate instantaneous timing information across the high speed/low speed boundary. Additional synchronization bit sequences (synchronization channel) are added to the desired data stream. This additional synchronization information can be resolved by the low speed circuit to identify boundary conditions. Search algorithms of a general nature are used in conjunction with the transfer strobe to determine if the data is being received correctly. In the event data is corrupted by any of the previously mentioned timing variances, the low speed circuit alerts the high speed circuit to alter its transfer strobe accordingly. Thus automatic in-circuit corrections can be made to compensate for timing variances.

The inverse direction of transfer from low speed to high speed circuitry is accomplished via a similar scheme except the synchronous identification and the tap delay select circuitry are all located in the high speed section. In general, clock select circuits for low speed to high speed interfacing are more straight-forward but the auto-compensating features of this invention allow higher transfer rates with reduced input/output connections. Use of a delay tap in the low speed to high speed direction is typically not required due to the availability of a high speed clock that effectively oversamples the lower speed transfer data. Whole clock increments can be selected to find the optimum strobe position in lieu of selecting finer delay increments.

As data frequencies become higher and packaging limitations grow more severe, the incentives to reduce signal connections outweigh the increase in circuit complexity. Power savings are also a critical concern in telecommunications and other electronic systems. By keeping the complex circuit in the low speed section, technologies such as complimentary metal oxide silicon (CMOS) can be used to minimize power consumption. The high speed circuit which may require emitter coupled logic (ECL) or other high power technologies is therefore simplified in design, not requiring complex functions for implementation.

SUMMARY OF THE INVENTION

The present invention is a transfer strobe time (phase) delay selector for converting a high speed digital data stream into a lower frequency data stream operating with a parallel group (word) of data. In order to accomplish this data conversion, a synchronization word (also referred to as a synchronization channel) is imbedded into the high speed digital data stream for purposes of detection and thereby synchronization of the low speed digital circuitry.

The present invention is specifically directed to use of a synchronization word (channel) which is associated with a frame of data so as to demarcate the start of each frame thereby allowing the high speed data to be synchronously transferred in parallel to a relatively low speed digital circuit. The present invention uses a delay line (delay stage module) with a plurality of taps (outputs) so as to adjust the time shift of a transfer strobe with respect to a latch signal used to control serial to parallel data conversion. A tap delay (delay stage) control circuit has an advance and a retard output control which is connected to a delay stage select control circuit which, via a multiplexer, controls which of the plurality of taps (outputs of the delay stages) is used for purposes of generating the transfer strobe.

In operation, upon initial power-up, a default transfer strobe delay is selected which nominally is set at one half the maximum selectable delay of the delay stage module. After several data frames have elapsed, the low speed synchronization channel identification module determines whether the synchronization channel has been accurately detected. If detection has not occurred, the delay stage control module increases the amount of time delay to the transfer strobe. A second wait time is used to determine if synchronization channel detection has occurred. This process is repeated until the synchronization channel is accurately detected, or until the maximum delay stage has been reached.

If the maximum delay stage has been reached, then the minimum delay stage is selected and the process continues until a successful synchronization detection channel is achieved.

Reverse direction of the delay stage selection process is equally applicable.

Once synchronization detection channel is accurately received, the remaining data in the data frame can then be accurately transferred by the low speed circuitry to other electronic circuitry. Such an arrangement is sufficient if there is little or no drift in the high speed data and consequently, little drift in the high speed synchronization channel.

If a time shift does occur as a result of temperature increases in the system or the like, then the low speed circuitry would sense loss of synchronization channel detection and as a result would restart the delay stage selection process until accurate synchronization channel detection is achieved.

The above methodology is sufficient provided that the resulting potential loss of data during the readjustment period can be tolerated by the end users of the low speed data. For applications involving telecommunications however, such inaccurate data during a readjustment period is generally not acceptable.

Consequently, the present invention can further incorporate an auxiliary strobe circuit. In this circuit an auxiliary transfer strobe is generated by a dual multiplexer. This auxiliary strobe is used to determine the delay stage boundaries for accurate synchronization channel detection. Whenever the auxiliary strobe circuitry determines that a timing shift of a sufficient magnitude has occurred, it alerts the primary strobe circuitry so as to shift its selected delay stage so as to prevent loss of synchronization channel detection and thereby prevent loss of incoming parallel data.

OBJECTS OF THE INVENTION

It is therefore a principal object of the present invention to provide a transfer strobe time delay selector for insuring the accurate transfer of data between synchronous high speed data circuits and synchronous low speed data circuits through use of a synchronization word (channel) associated with each frame of data and a plurality of delay stages to adjust a transfer strobe used in the low speed circuit for clocking purposes.

A further object of the present invention is to provide a transfer strobe time delay selector wherein the low speed circuitry includes a delay stage control module for varying the delay stage until accurate synchronization channel detection occurs by the low speed circuit.

A still further object of the present invention is to provide a transfer strobe time delay selector wherein an auxiliary transfer strobe is generated by the high speed circuitry and further wherein this auxiliary transfer strobe is continually adjusted so as to determine the optimum delay stage for purposes of synchronization channel detection, thereby providing for adjustment in the primary transfer strobe before loss of synchronization channel detection.

Other objects of the present invention will in part be obvious and will in part appear hereinafter.

BRIEF DESCRIPTION OF THE DRAWINGS

For a fuller understanding of the nature and obviousness of the present invention, reference should be made to the following detailed description taken in connection with the accompanying drawings, in which.

BEST MODE FOR CARRYING OUT THE INVENTION

In many areas of electronics including telecommunications, there are transfers of data operating at high speed, typically in excess of 150 megabits per second. At such speeds, current technology requires use of emitter coupled logic (ECL) or gallium arsenide logic (GaAs) fabrication techniques. Both ECL and GaAs technology have disadvantages, primarily in heat generation with respect to ECL technology and fabrication problems with regard to GaAs technology. Both of these technologies are also substantially more expensive to fabricate than lower speed complimentary metal oxide silicon (CMOS) technology which can operate at speeds less than 75 megabits per second.

Figure 2:
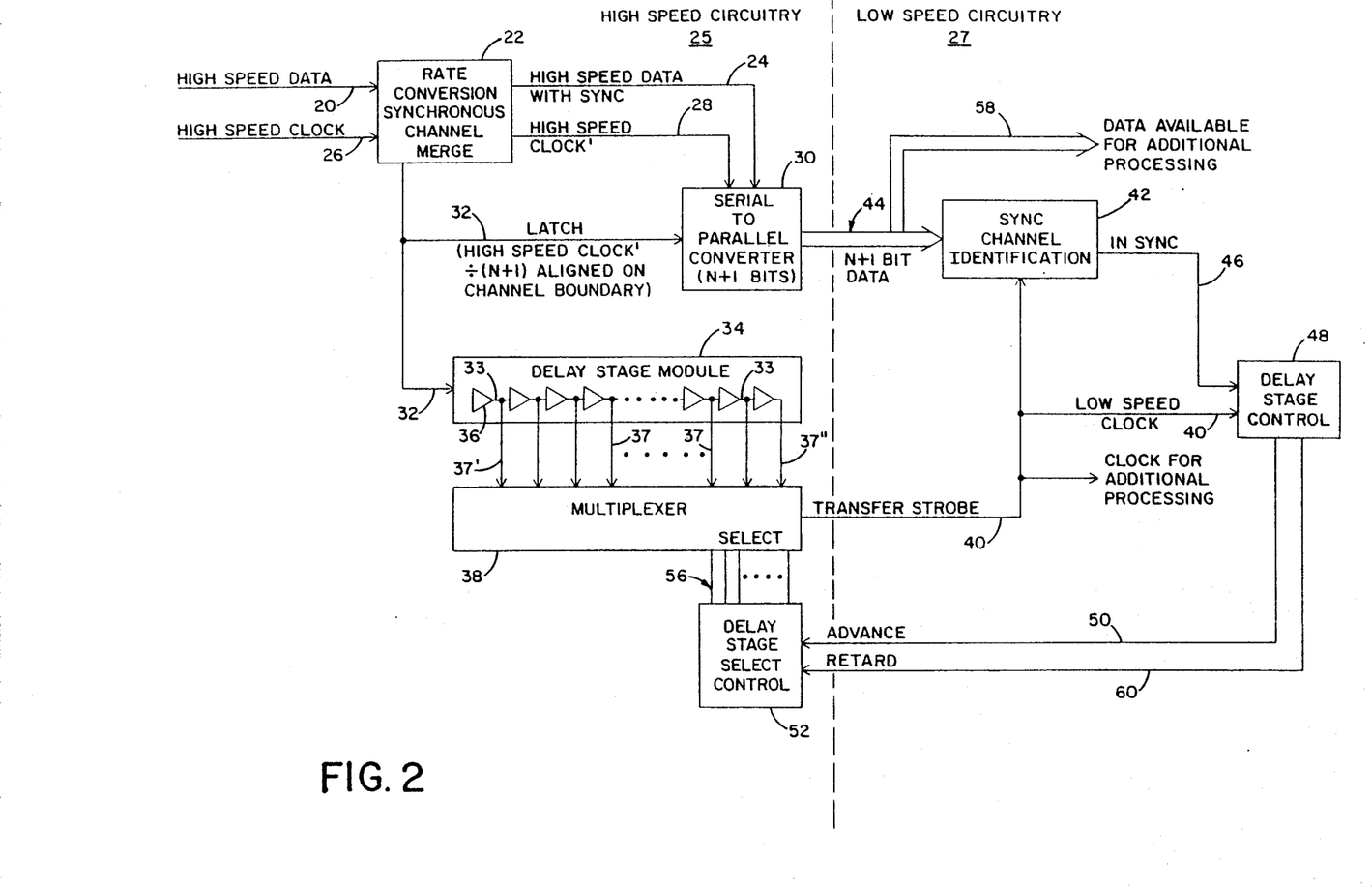
FIG. 2 is a detailed block diagram of an implementation of the transfer strobe time delay selector showing a portion of circuitry operating at high speed and a second portion operating at low speed as well as the data paths between the two portions for use in adjusting the time delay (phase) of a transfer strobe so as to accurately identify the synchronization channel and thus the parallel data from the high speed circuitry to the the low speed circuitry.

As seen in FIG. 2, the present invention is a transfer strobe time delay selector which provides an interface between high speed digital circuitry 25 using ECL or GaAs technology and lower speed digital circuitry 27 using CMOS technology (see demarcation dotted line 29). The invention is applicable to implementation in discrete integrated circuit fabrication as well as large-scale integration (LSI) design for any data transfer application, whether it be in digital electronics associated with telecommunications or otherwise.

In any transfer of data between a synchronous high speed digital circuit and a synchronous low speed digital circuit, serial to parallel data conversion from the high speed to the low speed circuitry is possible through use of a strobe generated from the high speed section to initiate data transfer. In such a configuration, the transfer rate is limited by the timing resolution of the low speed circuit as well as propagation delay fluctuations in any such transfer. As shown in FIG. 2, a stream of high speed data 20 is input to a rate conversion synchronization channel merge module 22 so as to output a high speed data stream with an imbedded synchronization channel (word) on output 24.

Figure 1:
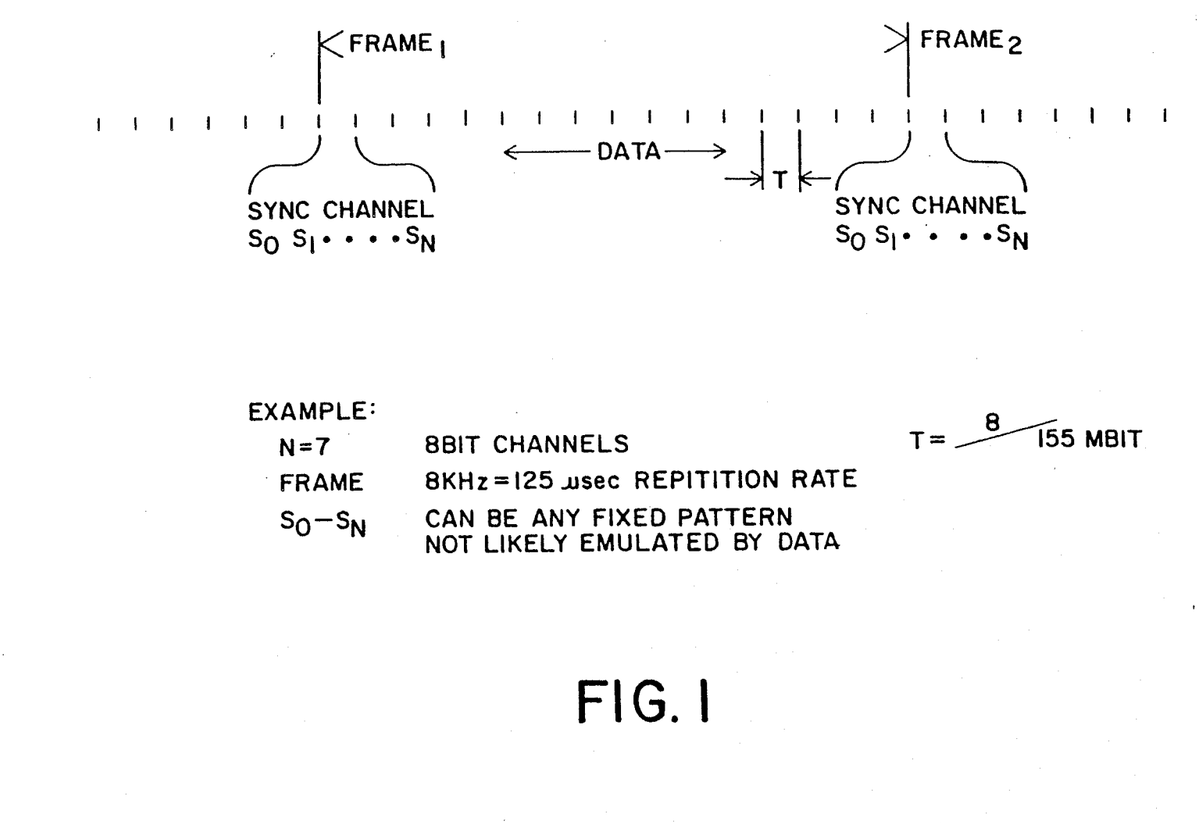
FIG. 1 is a diagrammatic representation of a data frame format wherein each frame contains a synchronization channel of a fixed pattern and a high speed data stream for synchronous conversion to a low speed data stream.

The data generated on output 24 basically has a format as shown in FIG. 1; that is a stream of data corresponding to the high speed data input stream 20 and a synchronization channel which begins each frame of data. The synchronization channel typically comprises a plurality of bits $s_0$ through $s_N$ where $N + 1$ is equal to the number of bits per synchronization channel. The actual data for bits $s_0$ through $s_N$ are arbitrary but would be any predetermined pattern of bits which would unlikely be produced by the high speed data stream 20.

The purpose of the synchronization channel at the beginning of each frame of high speed data is therefore to demarcate the frame of data, where the frame of data has a fixed length. In a typical implementation, the high speed data operates at 155.52 megabits per second. If an 8 bit data word is to be used at the low speed end, then the words propagate at a rate of 19.44 megawords per second (155.52/8). That is, the parallel data is transferred at a frequency of 19.44 mhz. It should be noted that the data transfer (or throughput) is still 155.52 megabits per second since each word contains 8 bits. Thus the high speed data is not lost by the low speed circuitry but rather is simply operated on in parallel in order to reduce the operating frequency to acceptable levels. In such a configuration, the synchronization channel can be designed to periodically occur every 125 microseconds and thus this synchronization channel word would occur at an 8 kilohertz rate (8 khz = $1/(125 \times 10^{-6})$). With 19,440 bits occurring per frame (155.52 megabits per second $\times$ 125 microseconds) the number of 8 bit words per frame is therefore 2,430. Thus for every 2,430 data words, one of these words is a synchronization word which demarcates the beginning of a frame.

As seen in FIG. 2, a second output of the rate conversion module 22 is a high speed clock' 28, which has a frequency aligned with the high speed data and synchronization information on output 24 so as to properly clock this incoming data and synchronization information into a serial to parallel converter 30 which comprises $N + 1$ bits of parallel data. For the above example the incoming high speed data is placed into a parallel configuration of 8 bits ($N = 7$).

A latch signal 32 which is equal to the frequency of the high speed clock' 28 divided by $N + 1$ so as to be aligned on the synchronization channel boundary is presented to the serial to parallel converter 30 so as to properly latch the incoming high speed data into a parallel configuration. This latch signal is also presented to a delay stage module 34 which comprises a plurality of delay stages 36, each stage having a similar but not necessarily identical time delay between its input 33 and its output 37. As seen in FIG. 2, the output 37 of each delay stage 36 is presented as an input to the next delay stage so that in effect the incoming latch signal 32 is progressively delayed as it propagates down the line of delay stages. Any output 37 of any delay stage 36 can be selected by multiplexer 38. The output 40 of multiplexer 38 is in effect a transfer strobe which represents a time delay (phase shift) of the incoming latch signal 32. One purpose of the transfer strobe is to control operation of a synchronization channel identification module 42 formed in the low speed circuitry. The synchronization channel identification module is used to properly identify the synchronization channel transferred by the $N + 1$ data bit parallel output 44 of the serial to parallel converter 30. Details of a synchronization channel identification module are presented in a copending U.S. patent application filed on the same date as the present application, assigned to the same assignee, entitled Parallel Frame Synchronization Circuit and Method; inventors William H. Stephenson, William E. Powell, Richard W. Peters and William B. Weeber (Mattern, Ware, Stoltz & Fressola docket no. 907-012). This U.S. patent application is hereby incorporated by reference.

The synchronization identification module 42 samples the $N + 1$ bits of parallel data on output bus 44 upon receipt of the transfer strobe signal. In operation, upon initial power-up of the high and low circuitry 25 and 27, a default transfer strobe delay is selected, typically equal to one-half the maximum delay time associated with module 34. For the above example, after several 125 microsecond frames, the synchronization identification module determines if a synchronization channel has been accurately detected by comparing the incoming $N + 1$ bit parallel data upon receipt of each transfer strobe to a predefined synchronization channel data pattern. If a match is found within a frame of data and if this match occurs repetitively at 125 microsecond intervals (the frame repetition rate, see FIG. 1), then the synchronization identification circuit 42 generates an "insynchronization" signal on line 46. This signal is transferred to a delay stage control module 48 to halt further adjustment of the delay associated with the transfer strobe.

If synchronization channel detection does not occur, the signal on line 46 cause the delay stage control module to generate an advance signal 50 for causing advancement of the time delay. This advancement is obtained through a delay stage select control module 52 which in turn generates a coded output on output lines 56. This coded output controls multiplexer 38 with respect to which delay stage output 37 is selected for generation of the transfer strobe output 40.

This advancement of the delay stage output selected and thus advancement of the transfer strobe signal time delay continues until either the synchronization channel is detected or the maximum delay stage (delay stage output 37") is selected. In the latter situation, the minimum delay stage output 37' is then selected with advancement of the selected delay stage output until synchronization channel detection occurs.

With each change of the selected delay stage, the synchronization identification module samples the $N + 1$ bit data for at least several frames so as to insure sufficient time to detect the synchronization channel if the transfer strobe delay is in fact an acceptable value.

Once the synchronization channel identification module 4 accurately detects the synchronization channel, the select process is effectively halted with the assurance that the parallel data transferred on output bus 44 is being received in an error-free manner. Such data is presented on output bus 58 for additional processing at the lower parallel data frequency rate.

For the example discussed above, the delay stages 36 of delay stage module 34 are non-inverting buffers with typical individual time delays of 0.5 nanosecond. The data transfer period is nominally 25.7 nanoseconds for $N = 3$ and 155.52 megabit data but can vary from approximately 5 to 35 nanoseconds. If each delay stage 36 has a nominal delay of 0.5 nanosecond, then approximately 60 delay stages would be used in module 34 to accommodate a 30 nanosecond spread (35-5 nanoseconds). For the above example, the approximate 0.5 nanosecond time resolution of module 34 is sufficient to properly receive the parallel data by the low speed circuitry since the parallel output data from module 30 is valid for more than 0.5 nanosecond (typically valid for 25.7 nanoseconds).

The circuitry shown in FIG. 2 for determining an error-free transfer of data from the high speed circuitry to the low speed circuitry through use of serial to parallel conversion and a transfer strobe delay stage selector does not guarantee that all subsequent data transfers after synchronization channel detection will continue to be received in an error-free manner unless the operating parameters are such as to not drift by more than one-half the transfer period. The reason for this result is that the synchronization channel identified in module 42 and associated delay stage control module 48 cannot sense an impending loss of synchronization channel identification due to propagation delay drift prior to such loss of detection. Consequently the selected delay stage 36 cannot be changed prior to loss of synchronization channel detection.

In actuality however, drift in the transmission of data can occur in excess of this minimum delay time which would effectively cause synchronization to be lost. In such a situation, the synchronization identification circuit can re-initiate a search for the synchronization channel by either advancing or retarding the previously selected delay stage through use of advance line 50 or retard line 60. Alternatively, the synchronization identification circuit can re-initiate an initial synchronization channel identification sequence wherein a nominal delay stage output is selected (typically equal to one-half the maximum time delay) with either advancing or retarding of this delay stage output until synchronization channel detection occurs. Such a configuration results in potential loss of data during the synchronization channel search sequence which is typically unacceptable in telecommunication applications (but not necessarily unacceptable for other applications where resending of information can occur).

Figure 3:
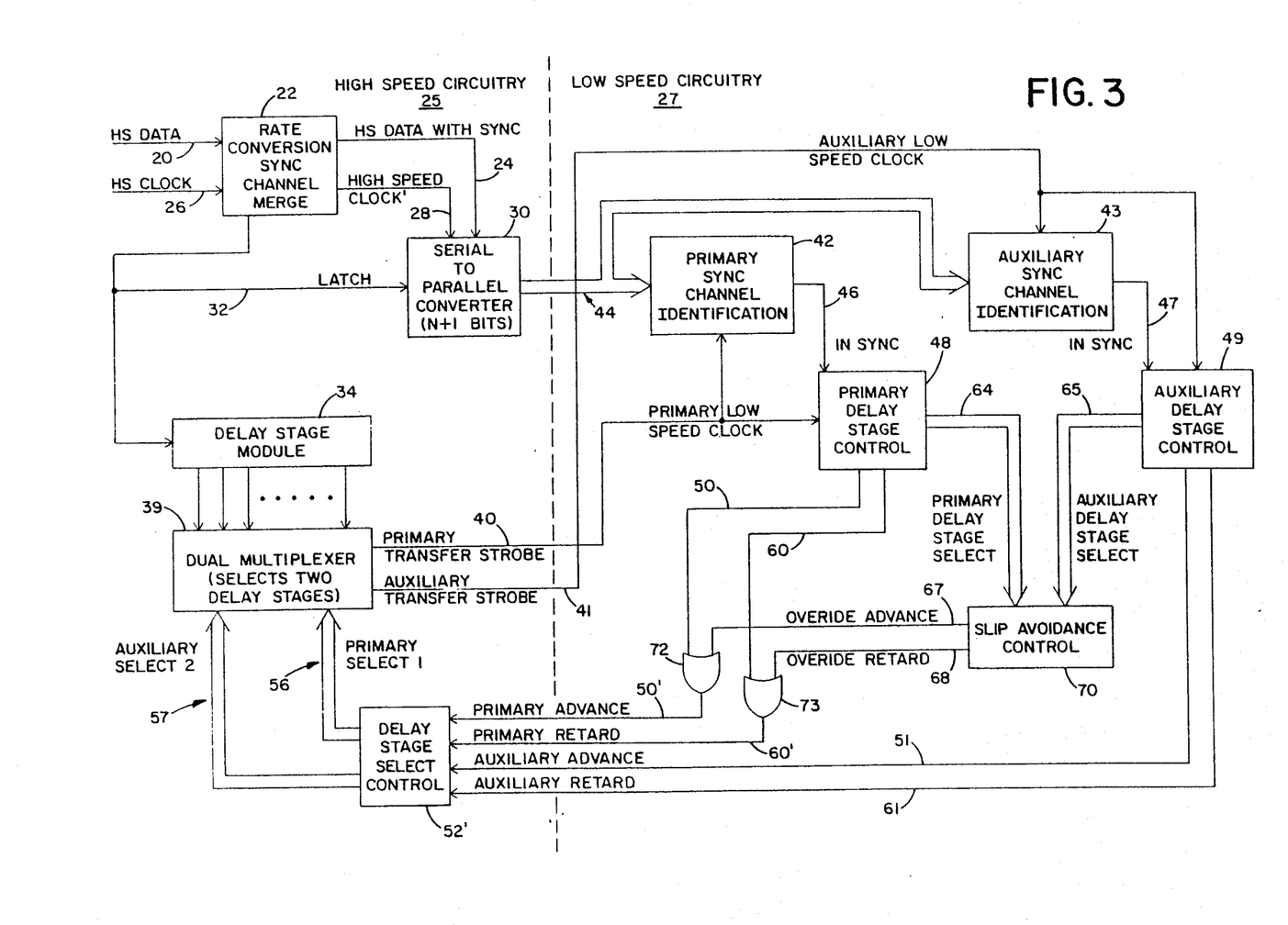
FIG. 3 is a detailed block diagram of a second embodiment of the present invention incorporating the circuitry shown in FIG. 2 and further incorporating an auxiliary transfer strobe and associated circuitry so as to dynamically adjust the primary transfer strobe so as to adjust the time delay of the primary strobe before loss of synchronization channel detection has occurred.

In order to overcome such potential loss of data due to drifts in the transfer of the data from the high speed circuitry to the low speed circuitry, an alternative embodiment of the present invention is presented as shown in FIG. 3. In this circuit, the high speed data channel 20, the high speed clock 26, the rate conversion and synchronization channel merge module 22, the high speed data and synchronization output 24, the high speed clock, output 28, the serial to parallel conversion module 30, the latch signal 32 as well as the delay stage module 34 correspond to those shown in FIG. 2. However, in addition to the transfer strobe on output 40 which is now identified as the primary transfer strobe, an auxiliary transfer strobe is generated on output 41 of dual multiplexer 39. The auxiliary transfer strobe controls the operation of an auxiliary synchronization channel identification module 43 which also receives the N + 1 bit data 44 from the serial to parallel converter 30.

Unlike the primary synchronization identification module 42 which upon proper detection of the synchronization channel maintains the selected delay stage output, the auxiliary synchronization channel identification module 43, upon proper detection of the synchronization channel as indicated by its corresponding "in synchronization" signal on line 47, commands its corresponding auxiliary delay stage control module 49 to either advance or retard the selected delay stage output by altering the selected delay stag on auxiliary select lines 57. In this manner, different delay stages are selected from delay stage module 34 with each selection being verified as to whether the synchronization channel is being properly detected by the auxiliary synchronization identification module 43.

Thus in operation there are generally a plurality of delay stages, each of which will result in synchronization channel detection by the auxiliary identification module 43. The auxiliary delay stage control module by continually advancing or retarding the selected delay stage output is able to dynamically determine one or both boundaries for proper synchronization channel identification.

The primary delay stage control output is presented on lines 64 and compared to the auxiliary delay stage control output selection on lines 65. If the primary selected delay stage varies by more than one delay stage as compared to the auxiliary optimal selected delay stage, then either an advance override signal 67 or a retard override signal 68 is generated by a slip avoidance control module 70 which in either situation is logically ORed with the corresponding primary delay stage control output 50 or primary delay stage retard output 60 via OR gates 72 and 73 respectively so as to increment either the primary advance output 50' or the primary retard output 60' for selection of a new delay stage for the primary transfer strobe. In this manner, the primary delay stage selected can be modified prior to loss of synchronization, thereby maintaining proper synchronization even if there are drifts in the transfer propagation delay from the high speed to the low speed circuitry.

An optimal transfer strobe delay determination can be made by the auxiliary delay stage control module adjusting the auxiliary transfer strobe to determine the minimum and maximum transfer strobe delays for accurate detection of the synchronization channel and setting the optimum transfer strobe delay to the minimum transfer strobe delay plus one-half the difference between the maximum and minimum transfer strobe delays. Other methods of determining an optimal transfer strobe delay could, of course, be used.

Thus what has been described is a circuit and method for insuring accurate transfer of data from a high speed circuit to a low speed circuit through use of a synchronization channel with accompanying delay stages for adjusting the synchronization identification timing of the low speed circuitry. The circuit and method incorporate use of feedback control elements for selecting different delay stages so as to detect accurate synchronization channel information and thereby accurately detect incoming parallel data.

A second embodiment of the invention further incorporates circuitry for dynamically determining an optimal time delay (delay stage) so as to maintain accurate synchronization and thereby prevent loss of data at the low speed end due to drifts in the propagation delay from the high speed circuitry to the low speed circuitry. This second embodiment incorporates an auxiliary transfer strobe signal and an associated auxiliary delay stage control module for continually monitoring the operation of an auxiliary synchronization identification module so as to insure that the optimum delay stage is determined on a real-time basis; thereby dynamically altering the time delay of the auxiliary transfer strobe.

The auxiliary delay stage control module through use of a slip avoidance control module is further able to adjust the primary transfer strobe time delay before loss of synchronization channel detection so as to be within a predetermined range of the auxiliary optimum delay stage setting and thereby insure continuous accurate data reception even if variations in the propagation delay occur between the high speed and the low speed circuitry.

It will thus be seen that the objects set forth above and those made apparent from the preceding description, are efficiently obtained and, since certain changes may be made in the above circuit and method without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed is:

1. A transfer strobe delay stage selector for insuring the accurate transfer of data between a high speed data stream associated with high speed circuitry and a low speed parallel data stream associated with low speed circuitry comprising:
   (A) means for periodically inserting a synchronization channel comprising N + 1 bits of data of a predetermined bit pattern into the high speed steam of data, where N is a positive integer;
   (B) means for converting the high speed stream of data and periodic synchronization channel into words of parallel data, each word of parallel data containing N + 1 bits;
   (C) means for generating a periodic latch signal having a repetition rate equal to the high speed bit transfer rate divided by N + 1;
   (D) a delay stage module for receipt of the latch signal, the delay stage module comprising a plurality of delay stages, each stage having a time delay between its input and its output, each stage having a selectable output, and each stage, except the last stage, connected as an input to the next stage;
   (E) means for selecting any one of the delay stage outputs of the delay stage module so as to generate a transfer strobe signal having a repetition rate the same as the latch signal, but time delayed equal to the sum of the time delays of the selected delay stage plus all the preceding delay stages;
   (F) a synchronization channel identification module for receipt of the parallel data generated by the means for converting the high-speed stream of data and operable so as to perform an identification process upon receipt of the transfer strobe signal, the synchronization identification module having means for generating an "in sync" signal on an output when a word of parallel data periodically matches a predetermined parallel data bit pattern; wherein the periodic matching occurs at the same rate as the periodicity of the synchronization channel, thereby effectively determining the proper detection of the periodic synchronization channel; and
   (G) a delay stage control module connected to said output of the synchronization channel identification module for causing the delay stage selecting means to change the delay stage selected when an "in-sync" signal is not received by the delay stage control module, and wherein modification of the selected delay stage is halted when an "in-sync" signal is received; whereby the transfer strobe signal is adjusted with respect to its time delay as compared to the latch signal until the synchronization channel identification module accurately detects the synchronization channel contained within the high-speed data stream, thereby insuring the accurate transferral of data between the high speed circuitry and the low speed circuitry.

2. A transfer strobe delay stage selector as defined in claim 1, wherein each delay stage comprises a non-inverting buffer.

3. A transfer strobe delay stage selector as defined in claim 2, wherein the delay stage control module has means to generate an advance signal or a retard signal for transfer to the delay stage selecting means so as to cause a delay stage, either after or before the previously selected delay stage, to be selected when the synchronization channel is not detected.

4. A transfer strobe delay stage selector as defined in claim 1, wherein the delay stage control module has means to generate an advance signal or a retard signal for transfer to the delay stage selecting means so as to cause a delay stage, either after or before the previously selected delay stage, to be selected when the synchronization channel is not detected.

5. A transfer strobe delay stage selector as defined in claim 1, further comprising;
   (H) a second, auxiliary, means for independently selecting any one of the time delay stage outputs of the delay stage module so as to generate an auxiliary transfer strobe signal;
   (I) a second, auxiliary, synchronization channel identification module for receipt of the parallel data generated by the serial to parallel converting means and operable so as to perform an identification process upon receipt of the auxiliary transfer strobe signal, the auxiliary synchronization identification module having means for generating an "in sync" signal on an output when a word of parallel data periodically matches a predetermined parallel data bit pattern; wherein the periodic matching occurs at the same rate as the periodicity of the synchronization channel, thereby effectively determining the proper detection of the periodic synchronization channel;
   (J) a second, auxiliary, delay stage control module connected to the output of the second synchronization channel identification module for causing the auxiliary delay stage selecting means to determine an optimal delay stage for synchronization channel detection; and
   (K) means for dynamically adjusting the selected delay stage of the delay stage selecting means associated with the transfer strobe once synchronization channel detection has occurred if the selected delay stag varies from the selected auxiliary delay stage by more than a predetermined amount.

6. A transfer strobe delay stage selector as defined in claim 5, wherein the second, auxiliary, delay stage control module varies the delay stage selected so as to determine when a particular delay stage results in non-detection of the synchronization channel and thereby determines the range of delay stages over which synchronization channel detection occurs so as to determine the optimal delay stage for synchronization channel detection 7. A transfer strobe delay stage selector as defined in claim 6, wherein the delay stage control module has means for generating a first signal for advancing and a second signal for retarding the time delay of the transfer strobe, and further wherein the delay stage selecting means comprises a delay stage select control module for receipt of the first and second signals so as to generate a delay stage select signal therefrom for selecting the delay stage output for the transfer strobe.

8. A transfer strobe delay stage selector as defined in claim 7, wherein the second delay stage control module has means for generating a first auxiliary signal for advancing and a second auxiliary signal for retarding the time delay of the auxiliary transfer strobe, and further wherein the second delay stage selecting means comprises a delay stage select control module for receipt of the first and second auxiliary signals so as to generate an auxiliary delay stage select signal therefrom for selecting the delay stage output for the auxiliary transfer strobe.

9. A transfer strobe delay stage selector as defined in claim 8, wherein the means for selecting the delay stage outputs and the second auxiliary means for selecting the delay stage outputs are implemented by a dual multiplexor receiving the delay stage select signal and the auxiliary delay stage select signal so as to select the transfer strobe and auxiliary transfer strobes respectively.

10. A transfer strobe delay stage selector as defined in claim 1, wherein the delay stage control module has means for generating a first signal for advancing and a second signal for retarding the time delay of the transfer strobe, and further wherein the delay stage selecting means comprises a delay stage select control module for receipt of the first and second signals so as to generate a delay stage select signal therefrom for selecting the delay stage output for the transfer strobe.

11. A transfer strobe delay stage selector as defined in claim 1, wherein the synchronization channel identification module and the delay stage control module are part of the lower speed circuitry.

12. A method of transferring data between a high speed data stream associated with high speed circuitry and low speed circuitry by use of a parallel data stream comprising the steps of:
  (1) periodically inserting a synchronization channel comprising N + 1 bits of data of a predetermined bit pattern into the high speed stream of data, where N is a positive integer;
  (2) converting the high speed stream of data and the periodic synchronization channel into words of parallel data, each word of parallel data containing N + 1 bits;
  (3) generating a periodic latch signal having a repetition rate equal to the high speed bit transfer rate divided by N + 1;
  (4) selectively delaying the latch signal so as to generate a transfer strobe signal therefrom;
  (5) receiving the parallel data and determining, under control of the transfer strobe signal, when the synchronization channel is detected;
  (6) when the synchronization channel is not detected, reselecting the latch signal delay so as to alter the time delay of the transfer strobe; and
  (7) repeating steps 4–6 until synchronization channel detection occurs.

13. A method of transferring data as defined in claim 12, wherein the selective delaying of the latch signal so as to generate a transfer strobe signal is performed in discrete intervals of selectable delay time intervals.

14. A method of transferring data as defined in claim 13, wherein the adjusting of the transfer strobe time delay channel detection occurs by increasing the time delay until synchronization channel detection occurs or until a maximum time delay is reached, and in the latter event, changing the time delay to a minimum value and increasing this value until synchronization channel detection occurs.

15. A method of transferring data as defined in claim 12, further comprising the steps of;
  (8) independently selecting a time delay of the generated latch signal so as to generate an auxiliary transfer strobe signal;
  (9) receiving the parallel data and determining, under control of the auxiliary transfer strobe signal, the detection of the synchronization channel;
  (10) adjusting the selected time delay associated with the auxiliary transfer strobe signal until synchronization channel detection occurs;
  (11) dynamically determining the optimal auxiliary transfer strobe time delay; and
  (12) comparing the optimal auxiliary transfer strobe time delay with the transfer strobe time delay and when the transfer strobe time delay varies therefrom by more than a predetermined amount, modifying the transfer strobe time delay so as to correspond with the auxiliary transfer strobe time delay; thereby preventing loss of synchronization channel detection under control of the primary strobe even when variations in the propagation delay between the high speed and the low speed circuitry occurs.

16. A transfer strobe delay stage selector for insuring the accurate transfer of data between a high speed data stream associated with high speed circuitry and a low speed parallel data stream associated with low speed circuitry, wherein the data stream includes a periodic synchronization channel comprising a plurality of bits of a predetermined pattern, comprising;
  (A) means for converting the high speed stream of data and periodic synchronization channel into words of parallel data;
  (B) means for generating a periodic latch signal;
  (C) a delay stage module for receipt of the latch signal, the delay stage module comprising a plurality of delay stages, each stage having a time delay between its input and its output, each stage having a selectable output, and each stage, except the last stage, connected as an input to the next stage;
  (D) means for selecting any one of the delay stage outputs of the delay stage module so as to generate a transfer strobe signal having a repetition rate the same as the latch signal, but time delayed equal to the sum of the time delays of the selected delay stage plus all the preceding delay stages;
  (E) a synchronization channel identification module for performing an identification process upon receipt of the transfer strobe signal, the synchronization identification module having means for generating an "in sync" signal on an output when a word of parallel data periodically matches a predetermined parallel data bit pattern; wherein the periodic matching occurs at the same rate as the periodicity of the synchronization channel, thereby effectively determining the proper detection of the periodic synchronization channel; and
  (F) a delay stage control module connected to said output of the synchronization channel identification module for causing the delay stage selecting means to change the delay stage selected when an "in-sync" signal is not received by the delay stage control module, and wherein modification of the selected delay stage is halted when an "in-sync" signal is received;

whereby the transfer strobe signal is adjusted with respect to its time delay as compared to the latch signal until the synchronization channel identification module accurately detects the synchronization channel contained within the high-speed data stream, thereby insuring the accurate transferral of data between the high speed circuitry and the low speed circuitry.

17. A transfer strobe delay stage selector as defined in claim 16, wherein each delay stage comprises a non-inverting buffer.

18. A transfer strobe delay stage selector as defined in claim 17, wherein the delay stage control module has means to generate an advance signal or a retard signal for transfer to the delay stage selecting means so as to cause a delay stage, either after or before the previously selected delay stage, to be selected when the synchronization channel is not detected.

19. A transfer strobe delay stage selector as defined in claim 16, wherein the delay stage control module has means to generate an advance signal or a retard signal for transfer to the delay stage selecting means so as to cause a delay stage, either after or before the previously selected delay stage, to be selected when the synchronization channel is not detected.

20. A transfer strobe delay stage selector as defined in claim 16, further comprising;

(G) a second, auxiliary, means for independently selecting any one of the time delay stage outputs of the delay stage module so as to generate an auxiliary transfer strobe signal;

(H) a second, auxiliary, synchronization channel identification module for performing an identification process upon receipt of the auxiliary transfer strobe signal, the auxiliary synchronization identification module having means for generating an "in sync" signal on an output when a word of parallel data periodically matches a predetermined parallel data bit pattern; wherein the periodic matching occurs at the same rate as the periodicity of the synchronization channel, thereby effectively determining the proper detection of the periodic synchronization channel;

(I) a second, auxiliary, delay stage control module connected to the output of the second synchronization channel identification module for causing the auxiliary delay stage selecting means to determine an optimal delay stage for synchronization channel detection; and (J) means for dynamically adjusting the selected delay stage of the delay stage selecting means associated with the transfer strobe once synchronization channel detection has occurred when the selected delay stage varies from the selected auxiliary delay stage by more than a predetermined amount.

21. A transfer strobe delay stage selector as defined in claim 20, wherein the second, auxiliary, delay stage control module varies the delay stage selected so as to determine when a particular delay stage results in non-detection of the synchronization channel and thereby determines the range of delay stages over which synchronization channel detection occurs so as to determine the optimal delay stage for synchronization channel detection.

22. A transfer strobe delay stage selector as defined in claim 21, wherein the delay stage control module has means for generating a first signal for advancing and a second signal for retarding the time delay of the transfer strobe, and further wherein the delay stage selecting means comprises a delay stage select control module for receipt of the first and second signals so as to generate a delay stage select signal therefrom for selecting the delay stage output for the transfer strobe.

23. A transfer strobe delay stage selector as defined in claim 22, wherein the second delay stage control module has means for generating a first auxiliary signal for advancing and a second auxiliary signal for retarding the time delay of the auxiliary transfer strobe, and further wherein the second delay stage selecting means comprises a delay stage select control module for receipt of the first and second auxiliary signals so as to generate an auxiliary delay stage select signal therefrom for selecting the delay stage output for the auxiliary transfer strobe.

24. A transfer strobe delay stage selector as defined in claim 23, wherein the means for selecting the delay stage outputs and the second auxiliary means for selecting the delay stage outputs are implemented by a dual multiplexor receiving the delay stage select signal and the auxiliary delay stage select signal so as to select the transfer strobe and auxiliary transfer strobes respectively.

25. A transfer strobe delay stage selector as defined in claim 16, wherein the delay stage control module has means for generating a first signal for advancing and a second signal for retarding the time delay of the transfer strobe, and further wherein the delay stage selecting means comprises a delay stage select control module for receipt of the first and second signals so as to generate a delay stage select signal therefrom for selecting the delay stage output for the transfer strobe.

26. A transfer strobe delay stage selector as defined in claim 16, wherein the synchronization channel identification module and the delay stage control module are part of the lower speed circuitry.

27. A method of transferring data between a high speed data stream associated with high speed circuitry and low speed circuitry by use of a parallel data stream, the high speed data stream including a periodic synchronization channel comprising a plurality of sequential bits of a predetermined pattern, wherein the method comprises the steps of:

(1) the high speed circuitry converting the high speed stream of data and the periodic synchronization channel into words of parallel data;

(2) the high speed circuitry generating a periodic latch signal;

(3) the high speed circuitry selectively delaying the latch signal so as to generate a transfer strobe signal therefrom;

(4) the low speed circuitry receiving the words of parallel data and determining, under control of the transfer strobe signal, when the synchronization channel is detected;

(5) when the synchronization channel is not detected, the low speed circuitry causing the high speed circuitry to change the selective delay of the latch signal so as to alter the time delay of the transfer strobe; and (6) repeating steps 3-5 unit synchronization channel detection occurs.

28. A method of transferring data as defined in claim 27, wherein the selective delaying of the latch signal so a to generate a transfer strobe signal is performed in discrete intervals of selectable delay time intervals.

29. A method of transferring data as defined in claim 28, wherein the adjusting of the transfer strobe time delay channel detection occurs by increasing the time delay until synchronization channel detection occurs or until a maximum time delay is reached, and in the latter event, changing the time delay to a minimum value and increasing this value until synchronization channel detection occurs.

30. A method of transferring data as defined in claim 27, further comprising the steps of;
 (7) independently selecting a time delay of the generated latch signal so as to generate an auxiliary transfer strobe signal;
 (8) determining, under control of the auxiliary transfer strobe signal, the detection of the synchronization channel;
 (9) adjusting the selected time delay associated with the auxiliary transfer strobe signal until synchronization channel detection occurs;
 (10) dynamically determining the optimal auxiliary transfer strobe time delay; and
 (11) comparing the optimal auxiliary transfer strobe time delay with the transfer strobe time delay and when the transfer strobe time delay varies therefrom by more than a predetermined amount, modifying the transfer strobe time delay so as to correspond with the auxiliary transfer strobe time delay; thereby preventing loss of synchronization channel detection under control of the primary strobe even when variations in the propagation delay between the high speed and the low speed circuitry occurs.

* * * * *